United States Patent
Marchand et al.

(10) Patent No.: US 11,533,019 B2
(45) Date of Patent: Dec. 20, 2022

(54) DRIFT COMPENSATION

(71) Applicants: STMicroelectronics (Grenoble 2) SAS, Grenoble (FR); STMicroelectronics S.r.l., Agrate Brianza (IT); STMicroelectronics (Rousset) SAS, Rousset (FR); STMicroelectronics (Alps) SAS, Grenoble (FR)

(72) Inventors: Benoit Marchand, Fontanil-Cornillon (FR); Hamilton Emmanuel Querino De Carvalho, Grenoble (FR); Achraf Dhayni, Vallauris (FR); Daniele Mangano, San Gregorio di Cata (IT)

(73) Assignees: STMicroelectronics (Alps) SAS, Grenoble (FR); STMicroelectronics (Rousset) SAS, Agrate Brianza (IT); STMicroelectronics S.r.l., Rousset (FR); STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/180,752

(22) Filed: Feb. 20, 2021

(65) Prior Publication Data
US 2021/0265950 A1    Aug. 26, 2021

(30) Foreign Application Priority Data
Feb. 21, 2020    (FR) ...................... 2001755

(51) Int. Cl.
*H04B 1/04* (2006.01)
*H03F 3/24* (2006.01)
*H03B 5/36* (2006.01)
*H03L 1/02* (2006.01)
*H03L 7/099* (2006.01)
*G06F 1/10* (2006.01)

(52) U.S. Cl.
CPC ................ *H03B 5/36* (2013.01); *G06F 1/10* (2013.01); *H03F 3/245* (2013.01); *H04B 1/0475* (2013.01); *H03B 2200/004* (2013.01); *H03F 2200/451* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 4,862,114 A | 8/1989 | Kleinberg | |
| 6,169,460 B1 * | 1/2001 | Wordelman | H03B 5/30 331/116 R |
| 6,362,700 B1 | 3/2002 | Fry | |

(Continued)

FOREIGN PATENT DOCUMENTS

| | | |
|---|---|---|
| EP | 0140343 A2 | 8/1982 |
| FR | 3074624 A1 | 6/2019 |

(Continued)

*Primary Examiner* — Pablo N Tran
(74) *Attorney, Agent, or Firm* — Slater Matsil, LLP (57) ABSTRACT

The present disclosure relates to an electronic device comprising a first capacitor and a quartz crystal coupled in series between a first node and a second node; an inverter coupled between the first and second nodes; a first variable capacitor coupled between the first node and a third node; and a second variable capacitor coupled between the second node and the third node.

20 Claims, 7 Drawing Sheets

(56) References Cited

U.S. PATENT DOCUMENTS

| | | | |
|---|---|---|---|
| 7,741,924 B2* | 6/2010 | Matsui | H03L 1/025 |
| | | | 331/177 V |
| 9,356,606 B2* | 5/2016 | Caffee | H03L 7/183 |
| 9,515,666 B2* | 12/2016 | Pavao-Moreira | H03L 7/099 |
| 11,239,796 B2* | 2/2022 | Mangano | H03L 1/022 |
| 2003/0197567 A1 | 10/2003 | Villella | |
| 2016/0277031 A1 | 9/2016 | Yonezawa et al. | |
| 2017/0279453 A1* | 9/2017 | Sato | H03B 5/32 |
| 2018/0358973 A1* | 12/2018 | Maruyama | H03B 5/366 |
| 2019/0305725 A1 | 10/2019 | Voor et al. | |

FOREIGN PATENT DOCUMENTS

| | | | |
|---|---|---|---|
| WO | 9411763 | | 5/1994 |
| WO | 0186809 | A2 | 11/2001 |

* cited by examiner

DRIFT COMPENSATION

CROSS-REFERENCE TO RELATED APPLICATIONS

This application claims the benefit of French Application No. 2001755, filed on Feb. 21, 2020, which application is hereby incorporated herein by reference.

TECHNICAL FIELD

The present disclosure relates generally to electronic devices and methods, in particular electronic devices comprising an oscillation circuit, and associated methods.

BACKGROUND

Electronic devices often comprise an oscillation circuit, in order to generate a desired central frequency.

A quartz crystal is often used in oscillation circuits. Indeed, a feature of quartz crystals is that they generate relatively stable oscillations when receiving an electric voltage.

SUMMARY

One embodiment addresses all or some of the drawbacks of known electronic devices comprising a quartz crystal.

One embodiment provides a method for controlling a device comprising an oscillation circuit, configured to provide a clock signal to a radio frequency circuit, and an antenna, in which the enabling of the passage of the signal from the circuit to the antenna is delayed with respect to an instant from which a power amplifier of the circuit is enabled.

According to an embodiment, the enabling of the passage of the signal from the circuit to the antenna corresponds to the shift of a switch from a first position to a second position, the first position being configured so that the no emission can be made via the antenna, and the second position being configured so that the emissions can be made via the antenna.

According to an embodiment, a single control signal is generated to enable the power amplifier and the passage of the signal from the circuit to the antenna, the delay being added to the single control signal before the control signal reaches a switch coupled between the circuit and the antenna with respect to the reaching of the amplifier by this control signal.

According to an embodiment, the duration of the delay is less than one second.

According to an embodiment, the duration of the delay is greater than 5 ms.

According to an embodiment, the duration of the delay depends on a temperature measured by a temperature sensor of the device.

According to an embodiment, the or each temperature is indicative of the ambient temperature.

According to an embodiment, the device comprises a plurality of duration values of the delay stored in a memory, each duration value corresponding to a range of temperatures.

According to an embodiment, the duration values associated with some of the temperatures are zero.

According to an embodiment, the duration values associated with at least one of the temperatures are different from zero.

According to an embodiment, the radio frequency circuit is a radio frequency transmitter.

According to an embodiment, the device comprises, coupled in series, a first variable capacitor, a first capacitor, a quartz crystal and a second variable capacitor, comprising controlling the capacitance of the first and second variable capacitors to be above 50% of their maximum capacitance.

According to an embodiment, the method comprises comprising the following steps: A) preheating the quartz; B) enabling the emission of signals as the temperature of the quartz decreases.

Another embodiment provides a device comprising a radio frequency circuit and an antenna; an oscillation circuit configured to provide a clock signal to the RF circuit; and a control circuit configured to enable a power amplifier of the radio frequency circuit and to enable the passage of signals from the circuit to the antenna, the enabling of the passage of the signal from the circuit to the antenna 20) being delayed with respect to an instant from which the power amplifier is enabled.

According to an embodiment, the device comprises a sensor configured to measure a temperature or a value representative of the temperature.

According to an embodiment, the device comprises a memory configured to store duration values of delays corresponding to ranges of temperature.

According to an embodiment, the device comprises, coupled in series, a first variable capacitor, a first capacitor, a quartz crystal and a second variable capacitor.

According to an embodiment, the device comprises a heater configured to increase the temperature of the quartz.

Another embodiment provides an electronic device comprising a first capacitor and a quartz crystal coupled in series between a first node and a second node; an inverter coupled between the first and second nodes; a first variable capacitor coupled between the first node and a third node; and a second variable capacitor coupled between the second node and the third node.

According to an embodiment, the value of the first capacitor is chosen, based on a target frequency, to reduce the equivalent capacity seen by the quartz with respect to a capacity resulting of the two variable capacitors only.

According to an embodiment, the first variable capacitor, the capacitor, the quartz crystal and the second variable capacitor are included in an oscillation circuit.

According to an embodiment, the oscillation circuit is configured to provide a clock signal to a circuit.

According to an embodiment, the circuit is an RF transmitter.

According to an embodiment, the variable capacitors are part of an integrated circuit and wherein the quartz crystal and the capacitor are not part of the integrated circuit.

According to an embodiment, the capacitance value of the first capacitor is constant.

According to an embodiment, the device comprises a second capacitor coupled between the quartz and the second variable capacitor.

According to an embodiment, the device comprises a radio frequency circuit and an antenna; an oscillation circuit configured to provide a clock signal to the RF circuit; and a control circuit configured to enable a power amplifier of the radio frequency circuit and to enable the passage of signals from the circuit to the antenna, the enabling of the passage of the signal from the circuit to the antenna 20) being delayed with respect to an instant from which the power amplifier is enabled.

According to an embodiment, the device comprises a heater configured to increase the temperature of the quartz.

Another embodiment provides a method for controlling of the previous device, comprising controlling the capacitance of the first and second variable capacitors to be above 50% of their maximum capacitance.

According to an embodiment, the method comprises controlling the capacitance of the first and second variable capacitors to be substantially equal.

According to an embodiment, the method comprises an oscillation circuit, configured to provide a clock signal to a radio frequency circuit, and an antenna, in which the enabling of the passage of the signal from the circuit to the antenna is delayed with respect to an instant from which a power amplifier of the circuit is enabled.

According to an embodiment, the method comprises the following steps A) preheating the quartz; B) enabling the emission of signals as the temperature of the quartz decreases.

Another embodiment provides a device comprising an electronic circuit; an oscillation circuit comprising a quartz, configured to provide a clock signal to the electronic circuit; and a heater configured to increase the temperature of the quartz.

According to an embodiment, the electronic circuit is a radio frequency transmitter and is coupled to an antenna.

According to an embodiment, the device comprises a control circuit configured to control the heater.

According to an embodiment, the heater is dedicated to preheating the quartz.

According to an embodiment, the heater is less than 10 mm away from the quartz.

According to an embodiment, the heater is a resistor.

According to an embodiment, the device comprises an antenna; a control circuit configured to enable a power amplifier of the circuit and to enable the passage of signals from the circuit to the antenna, the enabling of the passage of the signal from the circuit to the antenna being delayed with respect to an instant from which the power amplifier is enabled.

According to an embodiment, the device comprises, coupled in series, a first variable capacitor, a first capacitor, the quartz crystal and a second variable capacitor.

Another embodiment provides a method of controlling the previous device, comprising the following steps A) preheating the quartz; B) enabling the emission of signals as the temperature of the quartz decreases.

According to an embodiment, step A) comprises the increase of a current going through the resistor.

According to an embodiment, the temperature is multiplied at least by during the step A).

According to an embodiment, the enabling of the passage of the signal from the circuit to the antenna is delayed with respect to an instant from which a power amplifier of the circuit is enabled.

According to an embodiment, the method comprises controlling the capacitance of the first and second variable capacitors to be above 50% of their maximum capacitance.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

The. Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
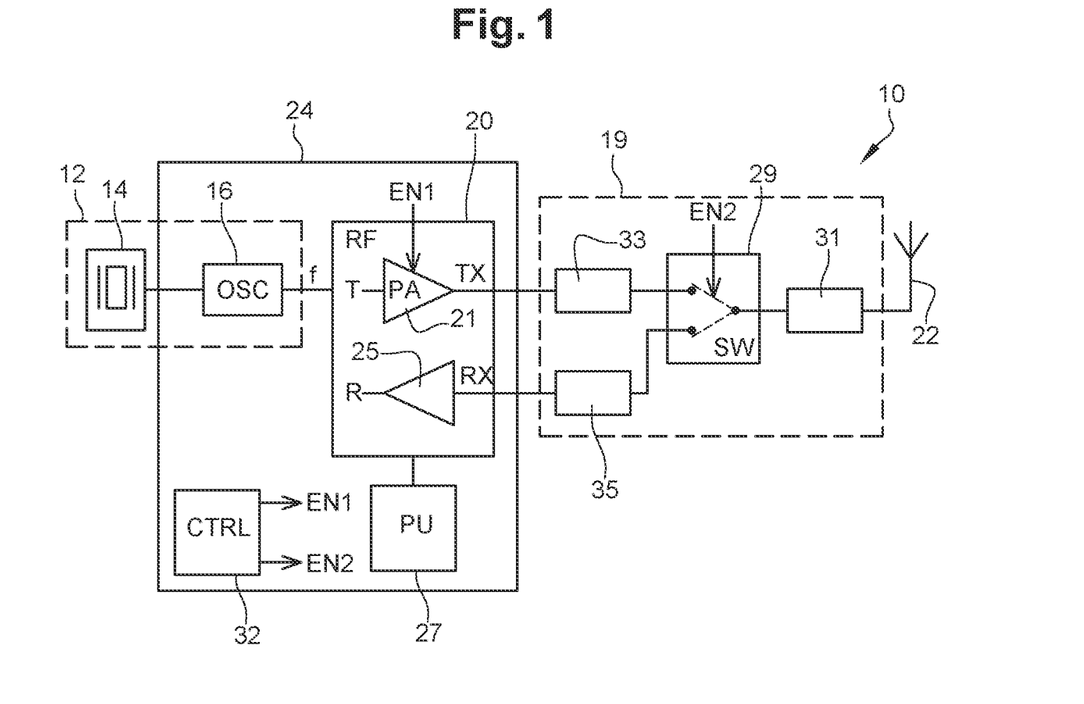
FIG. 1 illustrates, very schematically, an example of an electronic device capable of transmitting RF signals.

FIG. 1 illustrates, very schematically, an example of an electronic device 10 capable of transmitting RF signals. For example, the device 10 is adapted to low power and long-range transmissions. Preferably, the device is adapted to operate with the technology named LoRa (Long Range).

The device 10 comprises an oscillation circuit 12. The oscillation circuit 12 comprises a quartz crystal 14 and an oscillator (OSC) 16. The output of the oscillator 16 is coupled, preferably connected, to a transmitting circuit (RF) 20. The oscillation circuit 16 provides a clock signal, with a central frequency f, to the circuit 20. The desired value of the central frequency f is for example equal to 32 MHz.

Oscillator 16 and transmitting circuit 20 are integrated in a single circuit or chip 24, while quartz 14 constitutes an external component of circuit 24.

The circuit 20 is coupled to an antenna 22. The circuit 20 is for example an RF transmitter. In other words, circuit 20 is for example a transmitter capable of transmitting (emitting and receiving) signals at Radio Frequency (RF), in other words RF signals. The circuit 20 can emit and receive radio frequency signals. The circuit 20 constitutes an emission and/or reception head coupled to antenna 22 by various analog front-end circuits 19 (matching networks, converters, switches, balun, etc.). Front-end circuits are external to the chip 24.

The circuit 20 comprises an output TX on which the signals to be emitted are provided. The output TX is provided by a power amplifier 21 (PA) of the circuit 20. The power amplifier 21 comprises an input on which a signal T, representative of a signal to be emitted, is provided. The power amplifier 21 comprises an enabling input receiving a control signal EN1, or enabling signal EN1. The signal EN1 is a signal configured to enable or disable the power amplifier 21. The signal EN1 is for example a binary signal. A first value of the signal EN1, for example the high value '1', enables the power amplifier 21, and therefore allows the outputting of signal TX. A second value of the signal EN1, for example the low value '0', disables the power amplifier 21. Therefore, when the signal EN1 takes the second value, no signal can be emitted by the circuit 20.

The circuit 20 comprises an input RX, on which can be received signals coming from the antenna 22. More precisely, the signals received by the antenna 22 are provided to the input RX via front end circuits 19. The input RX is for example coupled, preferably connected, to an input of a low noise amplifier 25 of the circuit 20. An output of the low noise amplifier provides a signal R representative of the received signal RX.

The chip 24 comprises a processing unit 27 (PU). The processing unit 27 is coupled, preferably connected, to the circuit 20. The output of the low noise amplifier 25 and the input of the power amplifier 21 are for example coupled to the processing unit 27. The processing unit 27 is configured to process the data, and therefore the signal T, to be sent and to process the data, in other words the signal R, received. The links between the processing unit 27 and the power amplifier 21 and between the processing unit 27 and the low noise amplifier 25 are not detailed in FIG. 1.

The device 10 of FIG. 1 is a half-duplex system. Therefore, the device can either emit or receive signals, but cannot do both simultaneously. The output TX and the input RX of the circuit 20 are coupled to the antenna 22 by a switch 29 (SW). The switch 29 is coupled, on one side, to the output TX and to the input RX and, on the other side, to the antenna. In a first state of the switch 29, the antenna is coupled to the output TX. In this first state, it is possible to emit signals via the antenna 22. However, it is not possible to receive signals. In a second state of the switch 29, the antenna is coupled to the input RX. In this second state, it is possible to receive signals from the antenna 22. However, it is not possible to emit signals.

The switch 29 can also comprise a third state, not represented, in which the antenna is coupled to a node of high impedance.

According to an embodiment, the switch 29 receives a control signal EN2, or enabling signal EN2, different from the control signal EN1. The control signal EN2 takes different values depending on the desired state of the switch. For example, a first value of the signal EN2 ensures that the switch 29 is in the first state and a second value of the signal EN2 ensures that the switch 29 is in the second state. If the switch can be in more than two states, the control signal EN2 can take more than two values.

The switch 29 is part of the circuit 19 and is coupled to the antenna 22 and to the circuit 24 respectively by a block 31 and by blocks 33 and 35.

As illustrated in FIG. 1, block 31 couples the common node of switch 29 to the antenna 22, while blocks 33 and 35 respectively couple switched nodes of switch 29 to circuits 21 and 25.

The device 10 further comprises a control circuit (CTRL) 32. The control circuit 32 is configured to control different elements of the device 10. In particular, the control circuit 32 provides the control signals EN1 and EN2, respectively to the circuit 20 and the switch 29. Circuit 32 is for example integrated to chip 24.

When the power amplifier 21 is enabled, the outputting of signals is made possible on the output TX. However, once the power amplifier is enabled, its temperature increases significantly, which causes the increase of the temperature of the circuit 24. The increase of the temperature of the circuit 24 is at least partially responsible for a drift in the frequency of the clock signal provided to the circuit 20 by the oscillator 16. This drift corresponds to the difference between the actual central frequency of the signal that may be used by the transmitter 20 to emit a signal and the desired central frequency. The drift can also be at least partially caused by the heating of the quartz crystal. Such a drift is illustrated in FIG. 2.

Figure 2:
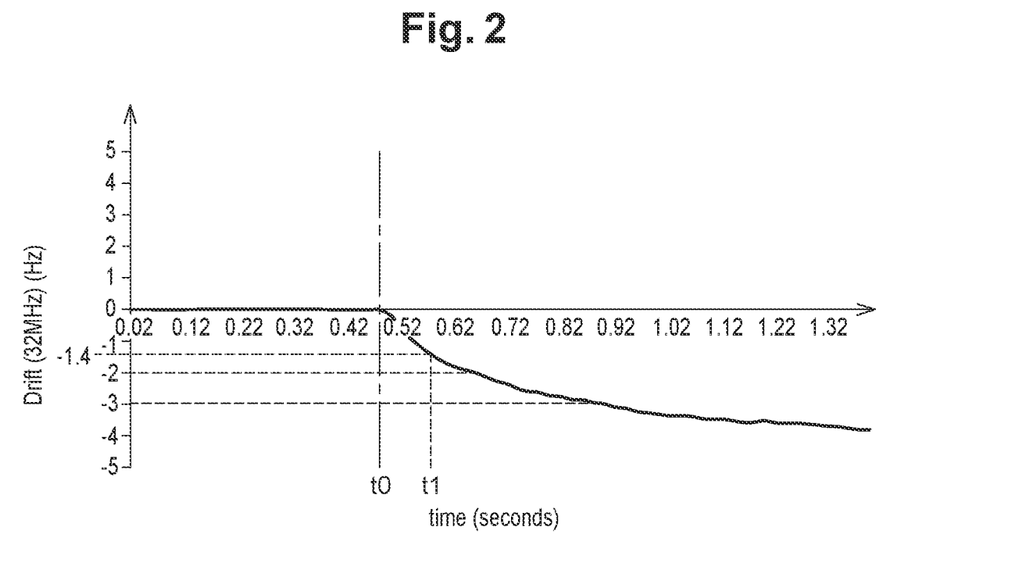
FIG. 2 is a graph illustrating the drift of a frequency of the device of FIG. 1 from a desired central frequency as a function of time.

FIG. 2 is a graph illustrating the drift (Drift (32 MHz) (Hz)) of a frequency of the device of FIG. 1 from a desired central frequency as a function of time (time (seconds)). The graph of FIG. 2 illustrates the impact of the heating of the power amplifier 21 of the circuit 20. The heating of the power amplifier 21 causes the drift of the frequency f provided to the RF transmitter 20 by the oscillation circuit 12.

The values of the drift are computed in comparison with a desired central frequency of 32 MHz. The drift is therefore equal to the difference between the actual value of the central frequency and the value 32 MHz.

Before an instant t0, the power amplifier is disabled and no emission can be made, therefore the temperature is substantially constant and there is no significant drift. The drift is therefore substantially equal to zero.

At the instant t0, the power amplifier 21, comprised in the RF circuit 20, is enabled. Therefore, the temperature of the chip 24 increases and the frequency f of the clock signal drifts away from the desired central frequency.

After the instant t0, the value of the drift decreases and becomes negative. In other words, the absolute value of the drift increases.

FIG. 2 represents the drift during a period of approximately one second after the enabling of the power amplifier 21. During this initial second of operation, the drift decreases and reaches a value substantially equal to −4 Hz. The value of the drift reaches the value −1.4 Hz at an instant t1.

It is particularly important for RF transmitters, such as the circuit 20, that the frequency of the clock signal is as constant as possible during operation (in particular during the emission or reception) of the transmitter (or receiver or emitter).

The drift can be particularly problematic during the initial period of emission. In some applications, for example in the case of the Wide Area Network LoRa (LoRaWAN)Cl, it is preferred, for example specified in the standards, that the absolute value of the drift, during the initial second of emission, be less than a threshold value th of 40 Hz, for a desired central frequency of 915 MHz. However, the drift is proportional to the desired central frequency. In consequence, the threshold value of 40 Hz for a desired central frequency of 915 MHz corresponds to a threshold value of the drift of around 1.4 Hz for a desired central frequency of 32 MHz. This threshold is crossed at the instant t1 of the example of FIG. 2.

A negative value of drift means that the real value of the frequency of the clock signal provided to the RF transmitter 20 is lower than the desired value. A positive value of drift means that the real value of the frequency is higher than the desired value. A value of the drift equal to zero means that the real value of the frequency of the clock signal provided to the RF transmitter is equal to the desired value.

According to an embodiment, the control circuit is configured to ensure a delay between the enabling of the power amplifier 21 and the enabling of the passage of the signal to be sent to the antenna from the output TX. For example, the enabling of the passage of the signal corresponds to putting the switch 29 in the state allowing the passage of signals to be emitted and not the passage of signals to be received. In other words, the control signal EN2 of the switch 29 is put at the first value '1' after the enabling of the power amplifier 21. Therefore, the signals EN1 and EN2 do not take their first value at the same instant. The control signal EN1 takes its first value and, after a delay, the control signal EN2 takes its first value. Such a method of controlling the device 10 is described in more detail in relation with FIG. 3.

Figure 3:
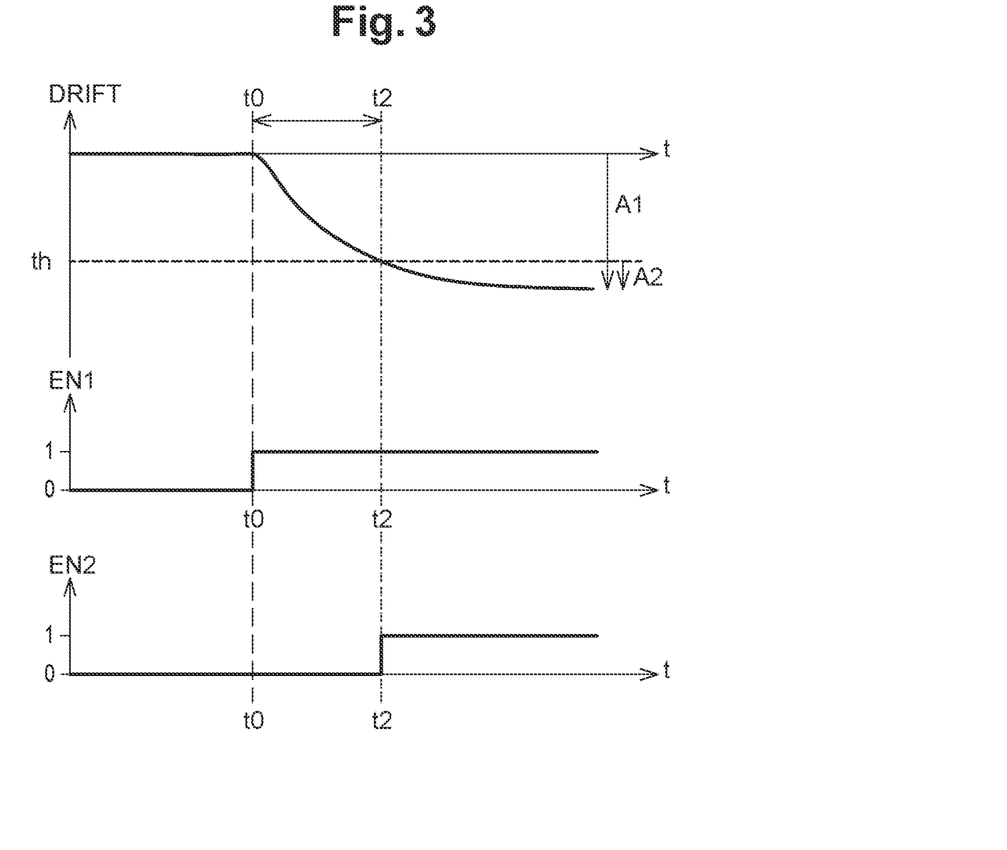
FIG. 3 is a graph illustrating the drift of a frequency of the device of FIG. 1 from a desired central frequency as a function of time and two signals of the device of FIG. 1.

FIG. 3 is a graph illustrating the drift (DRIFT) of the frequency f of the device of FIG. 1 from a desired central frequency as a function of time (t) and the two respective enabling signals (EN1, EN2) of the amplifier 21 and the switch 29 of the device of FIG. 1.

The values of the drift are computed in comparison with a desired central frequency of 32 MHz. The drift is therefore equal to the difference between the actual value of the central frequency and the value 32 MHz.

Before an instant to, the control signals EN1 and EN2 have the second value. In other words, before the instant to, the power amplifier 21 is disabled and the switch 29 is configured to allow the reception of signals but not the emission. As the power amplifier is disabled, it produces no heat and the drift is substantially equal to zero.

More generally, before the instant to, the switch 29 can be in any state. Indeed, as the power amplifier is disabled, no signal can be sent via the output TX, no matter the state of the switch 29.

At the instant to, the power amplifier 21 of FIG. 1 is enabled. In other words, the control signal generated by the control circuit 32 goes from the second value ('0') to the first value ('1'). Furthermore, the passage of the signal from the output TX to the antenna is blocked. In the example of FIG. 2, the control signal EN2 keeps the second value '0' corresponding to a receiving state. However, the switch can be in any state that does not permit the passage of a signal to be sent from the output TX to the antenna.

As the temperature of the power amplifier increase, the drift decreases. In other words, the absolute value of the drift increases. However, as the signal EN2 has the second value, there is no emission.

At an instant t2, later than the instant to and separated from the instant to by a delay D, the control signal EN2 takes the first value. Therefore, at the instant t2, signals to be emitted can reach the antenna to be sent to a receiving device.

At the instant t2, the emission starts and the receiving device starts receiving the signal emitted. The drift of the emitted signal is the drift A2, corresponding to the difference between the actual frequency of the emitted signal and the value of the frequency at the start of the emission.

The delay D is chosen in order to ensure that the drift A2 is under the threshold th described before. Furthermore, the delay D is preferably chosen to be as small as possible, while respecting the threshold th.

For example, the delay D is preprogrammed in the device, for example in a memory.

According to another embodiment, a single enabling signal is generated by the control circuit 32, but is delayed before reaching switch 29. For example, the device 10 comprises a component configured to add a delay equal to D to the single control signal before the control signal reaches the switch 29 with respect to the reaching of the amplifier 21 by this control signal.

One could have thought to use a quartz crystal compensated in temperature (TCXO or Temperature Controlled Crystal Oscillator) in order to compensate the drift caused by the enabling of the power amplifier. However, the cost of such a quartz will be considered as being too high in numerous applications.

The device 10 is preferably configured to operate with the technology LoRa. In such a case, it is desirable to use a standard chip 24, the hardware of which cannot be modified. Any modification or improvement must involve the programming of the components of the chip 24 and/or components external to the chip 24, but no modification of the components of the chip 24.

Figure 4:
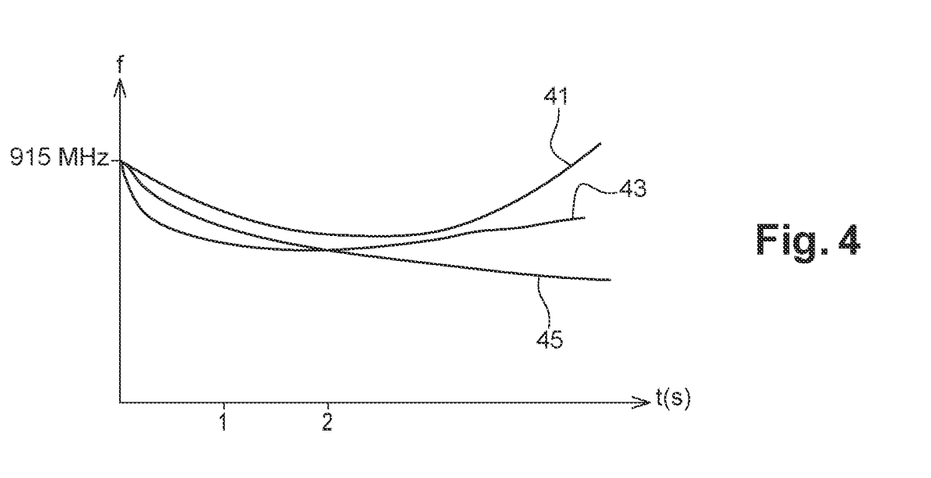
FIG. 4 is a graph illustrating the drift of a frequency of the device of FIG. 1 from a desired central frequency, as a function of time, for several ambient temperatures.

FIG. 4 is a graph illustrating the frequency f of the clock signal of the device of FIG. 1 as a function of time (t(s)) for several ambient temperatures.

FIG. 4 comprises three curves 41, 43, 45, each representing the frequency f for a different ambient temperature. The curve 41 corresponds to an ambient temperature of −40° C. The curve 43 corresponds to an ambient temperature of 80° C. The curve 45 corresponds to an ambient temperature of 25° C.

As it can be seen, depending on the temperature, the drift has different behaviors, depending on the ambient temperature. For example, the curve 41 corresponding to a temperature of 85° C., shows more important variations than the other curves.

The value of the instant t1 can be different for each value of the ambient temperature. For certain values of the temperature, the instant t1 can be equal to the instant to. The delay can therefore be equal to zero for some temperature, but not all temperatures. Indeed, for some temperatures, the absolute value of the drift stays below the threshold t during the first second after the instant t1.

According to an embodiment, the device 10 is programmed with a single value of the delay D. This value is preferably chosen according to the worse case of instants t1 corresponding to the temperatures at which the device is expected to operate.

According to a preferred embodiment, the delay D between the enabling of the power amplifier 21 and the enabling of the switch 29 is selected based on the value of the temperature measured by a temperature sensor (SENSOR). The sensor is integrated in the chip 24. The temperature measured by the sensor is for example the temperature at the external surface of the device, and thus for example indicates the ambient temperature around the device. Alternatively, the temperature measured by the sensor is the temperature inside the device 10, for example the temperature on the chip 24.

Several values of the delay D can be programmed in the device 10. For example, each value of the delay D can be associated with a range of ambient temperatures.

The different instants t1 and the corresponding ranges of temperature, that are for example programmed in a memory of the device, are preferably generated during the manufacture or during a calibration process. For example, the variations of the drift are determined for a plurality of temperatures, each of the plurality of temperatures corresponding to a range of temperatures. This step is either carried out on each device or on a device representative of a batch of devices. Alternatively, this calibration process may not be implemented. The different instants t1 and the corresponding ranges of temperature, are for example predefined values.

Figure 5:
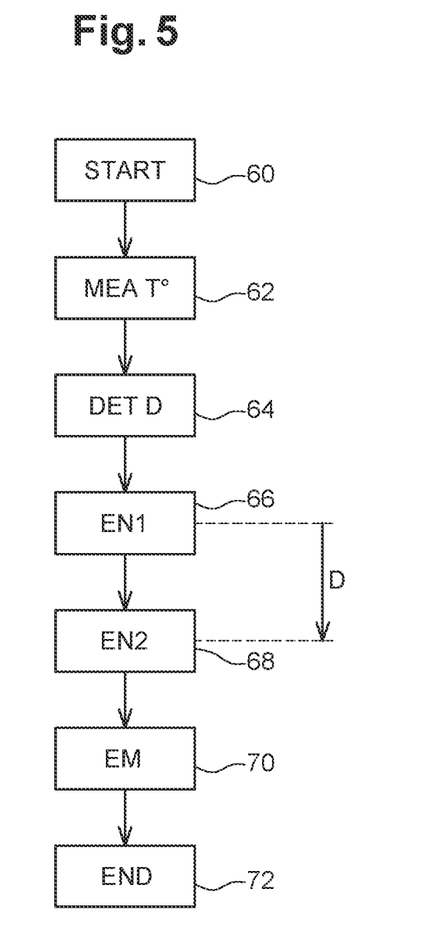
FIG. 5 represents, schematically, a method for controlling the device of FIG. 1.

FIG. 5 represents, schematically, a method for controlling the device of FIG. 1. Preferably, the steps of the method are successive. The method is for example implemented by hardware or software. The method is for example implemented by a state engine.

The method described in relation with FIG. 5 is for example executed at the beginning (Block 60, START) of the emission of each signal emitted, or at the beginning of the emission of each group of signals.

During a first step of the method, the temperature sensor measures the temperature (Block 62, MEA T°). This temperature is then compared to the values or range of values programmed in the device 10, and the value of the delay D is determined (Block 64, DET D) as a function of this value or range of temperatures.

During a following step, the control circuit ensures that the power amplifier is enabled (Block 66, EN1), while the passage of signals from the output TX to the antenna is disabled. For example, the control circuit ensures that the signal EN1 takes the first value ('1'), while the signal EN2 has the second value ('0'). While the signal EN1 has the first value and the signal EN2 has the second value, a dummy signal T is for example applied on the input of the power amplifier 21.

The delay D starts at the enabling of the power amplifier. For example, a counter starts counting at the enabling of the power amplifier. When the value of the delay D is reached, the passage of the signals to be emitted is allowed (Block 68, EN2). For example, when the counter reaches the value D, the control signal EN2 takes the first value '1', while the control signal EN1 keeps the first value. One or several emissions can be made (Block 70, EM).

Once one or several signals have been emitted (Block 72, END), the power amplifier can be disabled and the passage of signals from the output TX to the antenna can be blocked, for example by putting the value of the control signal EN2 to the second value.

An advantage of the embodiment described in relation with FIGS. 1 to 5 is that the drift seen by the receiving device is reduced.

Another advantage of the embodiment described in relation with FIGS. 1 to 5 is that it can be implemented without structurally modifying circuit 24.

Figure 6:
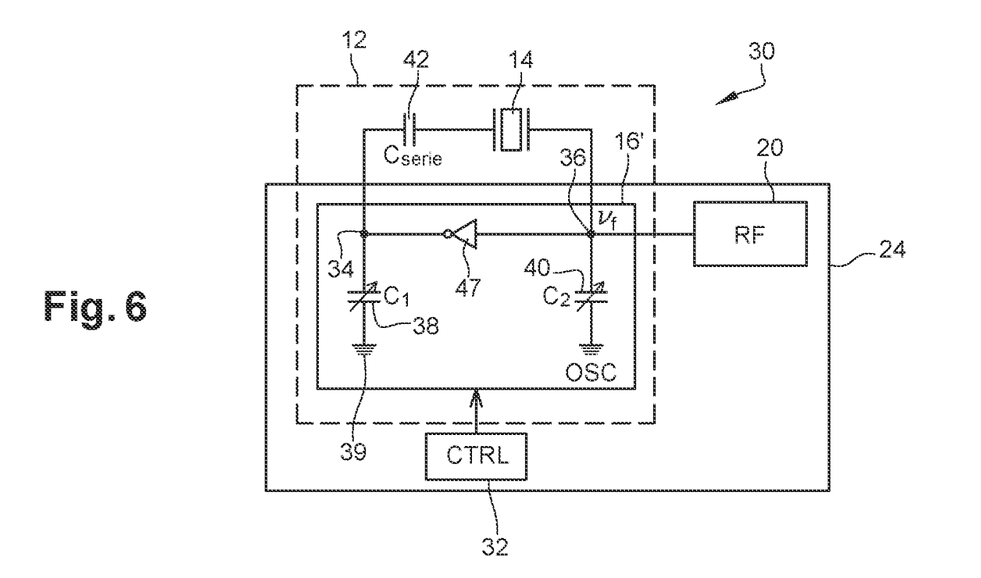
FIG. 6 schematically illustrates an embodiment of a device comprising an oscillation circuit.
Figure 7:
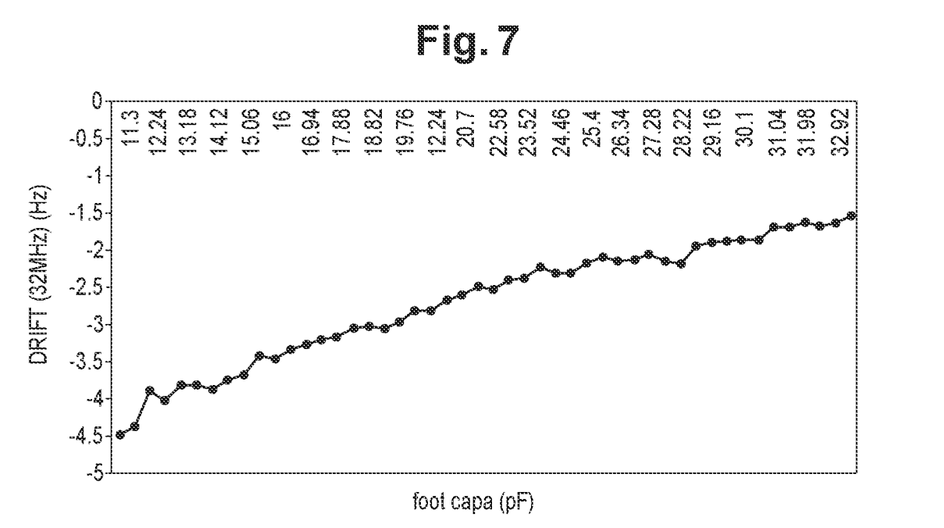
FIG. 7 is a graph illustrating the drift of the frequency of the device of FIG. 6 as a function of the capacitance value of capacitors of the oscillation circuit of FIG. 6.
Figure 8:
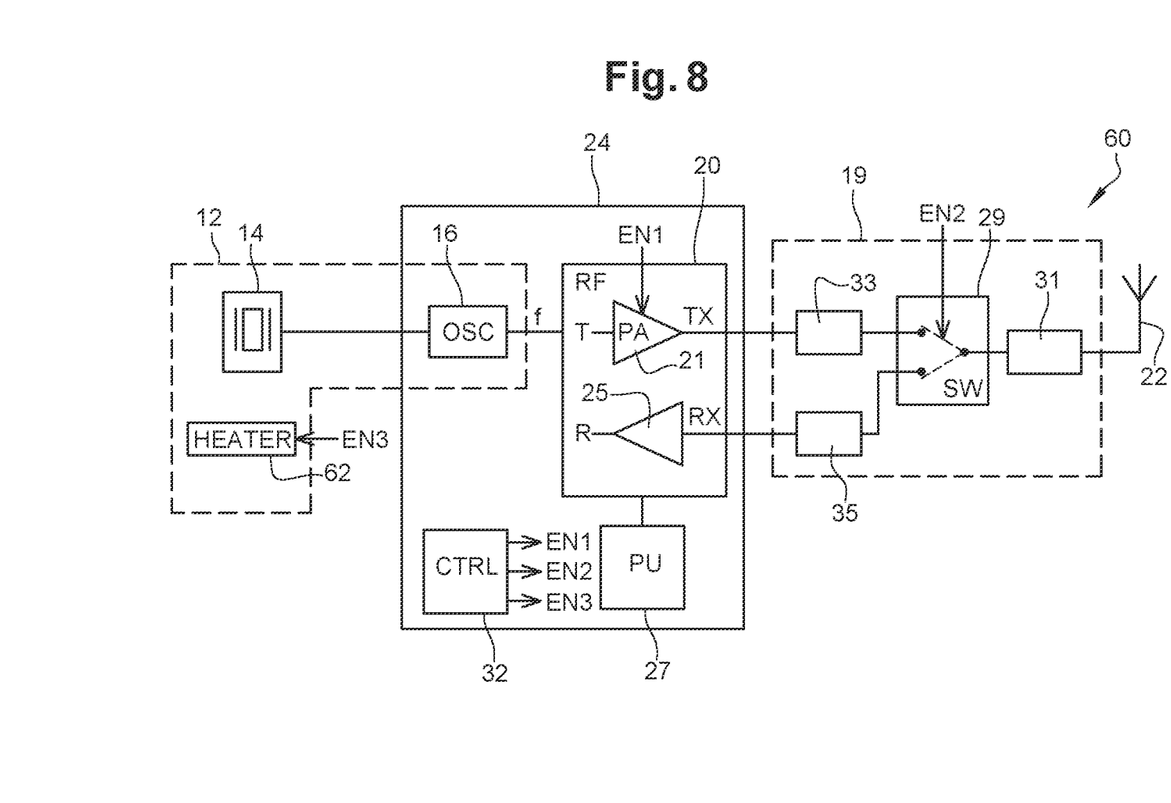
FIG. 8 illustrates, very schematically, an example of an electronic device capable of transmitting RF signals.

Another aspect of the present description is described in relation with the FIGS. 6 to 8.

FIG. 6 schematically illustrates an embodiment of a device 30 comprising an oscillation circuit. Though some elements may not be represented, the device 30 preferably comprises all the elements having already been described in relation with FIG. 1. They will not be described again in detail. In particular, the device 30 comprises the quartz crystal 14 and the integrated circuit 24, comprising the RF transmitter 20. The device 30 may also comprise, among others, the antenna 22, the front-end circuit 19 and the processing unit 27, not represented in FIG. 6.

The oscillation circuit 12 provides a clock signal ($v_f$), having the frequency f, to the transmitter 20. The oscillation circuit 12 is for example a Pierce oscillator.

The oscillation circuit 12 comprises the oscillator 16. The oscillator 16 comprises an inverter 47. An output terminal of the inverter 47 is coupled, preferably connected, to a first node 34. An input terminal of the inverter is coupled, preferably connected, to a second node 36. The second node 36 constitutes the output node of the oscillator. The second node 36 is coupled, preferably connected, to an input terminal of the transmitter 20. The clock signal of is provided at the second node 36.

The first node 34 is coupled, preferably connected, to a terminal of a variable capacitor ($C_1$) 38. The other terminal of the capacitor 38 is coupled, preferably connected, to a reference node 39, or a node of application of a reference voltage, receiving a reference voltage. Preferably, the reference node 39 is the ground.

The second node 36 is coupled, preferably connected, to a terminal of a variable capacitor ($C_2$) 40. The other terminal of the capacitor 40 is coupled, preferably connected, to the reference node 39 receiving the reference voltage.

The variable capacitor 38, the inverter 47 and the variable capacitor 40 are coupled, preferably connected, to each other in series, in this order.

The capacitors 38 and 40 are foot capacitors. The capacitors 38 and 40 are used to modify the capacitance seen by the quartz crystal 14 during a calibration phase of the assembly in order to compensate the fabrication dispersion of the quartz 14. The capacitors 38 and 40 are, preferably, identical to each other (apart from manufacturing tolerances).

The control circuit 32 is configured to control the variable capacitors 38 and 40.

As will be shown in more detail in relation with FIG. 7, an increase of the capacitance values of the variable capacitors 38 and 40 causes, advantageously, the reducing of the absolute value of the drift of the frequency of the clock signal provided to the circuit 20. However, the increase in the capacitance value of the capacitors 38 and 40 also impacts the value of the capacitance seen by the quartz, and therefore impacts the value of the central frequency f of the clock signal.

In order to compensate the modification of the capacitance value seen by the quartz, a capacitor 42 ($C_{SERIE}$) is coupled, preferably connected, in series with the quartz crystal 14. The capacitor 42 allows the use of higher capacitance values for the capacitors 38 and 40 while maintaining the value of the capacitance seen by the quartz substantially equal to a target capacitance $C_L$.

The quartz crystal 14 and the capacitor 42 are coupled, in series, between the first node 34 and the second node 36. A terminal of the quartz crystal 14 is coupled, preferably connected, to a terminal of the capacitor 42. The other terminal of the quartz crystal is for example coupled, preferably connected, to the second node 36. The other terminal of the capacitor 42 is for example coupled, preferably connected, to the first node 34. As a consequence, the variable capacitor 38, the capacitor 42, the quartz crystal 14, and the variable capacitor 40 are coupled, preferably connected, in series, in this order. The inverter is coupled, preferably connected, in parallel with the assembly of the quartz 14 and the capacitor 42.

Alternatively, the variable capacitor 38, the quartz crystal 14, the capacitor 42 and the variable capacitor 40 can be coupled, preferably connected, to each other in series, in this order.

Alternatively, the capacitor 42 can be replaced by two capacitors located on each side of the quartz 14, one being between the quartz and the node 34 and the other being between the quartz and the node 36. The values of the two capacitors are for example chosen to be, together, equivalent to the value of capacitor 42.

The capacitor 42 is preferably a capacitor with a constant capacitance value $C_{SERIE}$. The capacitor is preferably not a variable capacitor. In other words, the value of the capacitor 42 is preferably not controlled by the control circuit 32. The value of the first capacitor 42 is preferably chosen, based on a target frequency, to reduce the equivalent capacity seen by the quartz with respect to a capacity resulting of the two variable capacitors only.

Preferably, the capacitors 38 and 40 are controlled in such a way that their capacitances are substantially equal.

The target capacitance $C_L$ seen by the quartz crystal 14 is, in this example, equal to:

$$C_L = \frac{C_1 * C_2 * C_{SERIE}}{C_{SERIE} * (C_1 + C_2) + C_1 * C_2} + C_{STRAY} \qquad \text{[Math 1]}$$

where $C_1$ is the capacitance value of the capacitor 38, $C_2$ is the capacitance value of the capacitor 40, $C_{SERIE}$ is the capacitance value of the capacitor 42, and $C_{STRAY}$ is the capacitance value of stray, or parasite, capacitances.

The capacitance $C_{SERIE}$ of the capacitor 42 is, in consequence, equal to:

$$C_{SERIE} = \frac{C_B * (C_L - C_{STRAY})}{C_B - 2 * (C_{STRAY} + C_L)} \qquad \text{[Math 2]}$$

where $C_L$ is the target value of the capacitance seen by the quartz crystal, and $C_B$ is equal to the value $C_1$ and also equal to the value $C_2$ ($C_B=C_1=C_2$).

For example, if the target value is substantially equal to 10 pF, if the capacitances $C_1$ and $C_2$ are each equal to 27 pF, and the capacitance $C_{STRAY}$ is equal to 5 pF, the capacitance $C_{SERIE}$ is equal to 60 pF. More generally, capacitances $C_1$, $C_2$, and $C_{SERIE}$ are selected in order to obtain a capacitance $C_L$ in the range from 8 pF to 15 pF.

As the chip 24 cannot generally be modified in order to operate with the LoRa technology, the capacitor 42 is for example not located in the chip 24, but outside the chip 24 (external to the chip 24). In some other embodiments, the capacitor 42 can for example be located in the chip 24.

FIG. 7 is a graph illustrating the drift (DRIFT (32 MHz) (Hz)) of the frequency of the device of FIG. 6 as a function of the capacitance value of foot capacitors (foot capa (pf)) of the oscillation circuit 16.

The drift values are in Hertz (Hz) and the capacitance values $C_1$ and $C_2$ are in picofarad (pF). The drift values are taken substantially 700 ms after the enabling of the power amplifier of the circuit 24 (the instant to of FIG. 2). In this example, the instant to and t2 of FIG. 3 are the same. The values are thus taken during the first second after the enabling of the power amplifier and the start of the emission.

FIG. 7 illustrates values obtained empirically, by simulation or experimentation. In the corresponding simulations or experiments, the capacitance values correspond to the possible values of the variable capacitors 38 and 40. In other words, the capacitance values of the FIG. 7 correspond to the range of possible values of the variable capacitor 38 and 40. It was considered that the values of both the variable capacitors are equal. The capacitance values are in the range from 11.3 pF to 32.92 pF.

The drift values are in the range from −4.5 Hz, for capacitance values $C_1$ and $C_2$ substantially equal to 11 pF, to −1.5 Hz, for capacitance values $C_1$ and $C_2$ substantially equal to 33 pF.

The values are dependent on the experimental conditions. Nonetheless, it is possible to observe a general tendency, in which the drift decreases in absolute value, as the capacitance values increase. In other words, the drift draws closer to null as the capacitance values of the capacitors 38 and 40 increase.

Therefore, as indicated above, increasing the capacitance values of the capacitor 38 and 40 has the benefit of reducing the absolute value of the drift. It is therefore useful for the capacitance value of the capacitors 38 and 40 to be as high as possible in the range of values of the variable capacitors 38 and 40. However, in order to keep the possibility of slightly adjusting the capacitance values of the capacitors 38 and 40 during the operation of the oscillation circuit 12, it is preferable to select capacitance values of the capacitors 38 and 40 under their maximum value, for example with a margin substantially equal to 3 pf.

Preferably, the capacitors 38 and 40 are controlled so that, at least during the first second after the start of the oscillator, the values $C_1$ and $C_2$ are equal to at least 50% of their maximum value, preferably strictly above 50% of their maximum value, preferably between 60 and 85% of their maximum value, and for example substantially equal to 75% of their maximum value. The capacitance value $C_{SERIE}$ is selected to correspond, as described previously, to capacitors 38 and 40 having a value between 60 and 85% of their maximum value.

An advantage of the embodiments described is that the drift from the desired frequency is decreased. The drift can be decreased enough to satisfy the requirements of the devices.

Another advantage of the embodiments described is that relatively few components are added to the device.

Another aspect of the present description is described in relation with the FIGS. 9 to 12.

FIG. 8 illustrates, very schematically, an example of an electronic device 60 capable of transmitting RF signals. The device 60 comprises all elements of the device 10 of FIG. 1. Therefore, the device 60 comprises the quartz 14, the antenna 22, the front-end circuits 19, and the chip 24. The chip 24 comprises the oscillator 16, the circuit RF 20, the processing unit 27 and the control circuit 32.

The device 60 further comprises a heater 62. (HEATER). The heater is a heat dissipating electrical component. The heater 62 is for example a resistive element. The heater 62 is for example in the circuit 12 and not in the integrated circuit 24.

The heater 62 is located close enough to the quartz 14 that the variation of the temperature around the heater can impact the quartz. Preferably, the heater is as close as possible to the quartz. For example, the heater is located on the quartz. For example, the heater can be adjacent to the quartz. For example, the distance between the heater 62 and the quartz 14 is less than 10 mm, preferably less than 5 mm, preferably less than 2 mm. Preferably, the distance between the heater 62 and the quartz 14 is less than 1 mm. For example, the distance between the heater 62 and the quartz 14 is substantially equal to 1 mm. For example, the heater is in contact with the quartz.

The heater is preferably used only for the heating of the quartz. Preferably, the heater is dedicated to the function of preheating the quartz 14.

The heater is for example a resistor. For example, the value of the resistance of the resistor is in the range between 50 Ohms and 150 Ohms, for example equal to substantially 75 Ohm.

The heater is for example part of an electronic circuit also comprising components configured to control the heater 62. For example, if the heater is a resistor, the resistor is part of a circuit configured to send a current through the resistor in order to increase the heat dissipated by the resistor.

The control circuit 32 generates a control signal EN3, or enabling signal EN3. The control signal EN3 determines the state of the heater, and especially if the heater generates heat or not. For example, if the heater is a resistor, the control circuit 28 controls the current going through the resistor. For example, the signal EN3 can take at least two values, a first value which ensures that a given current can go through the resistor, and a second value which ensures that no current can go through the resistor. In this case, when the control signal EN3 takes the first value, the temperature of the heater, and therefore the temperature of the quartz, increases to a new temperature. When the control signal EN3 takes the second value, the temperature of the heater, and therefore the temperature of the quartz, decreases, for example until the heater reaches the temperature it had before the control signal EN3 took the first value.

Figure 9:
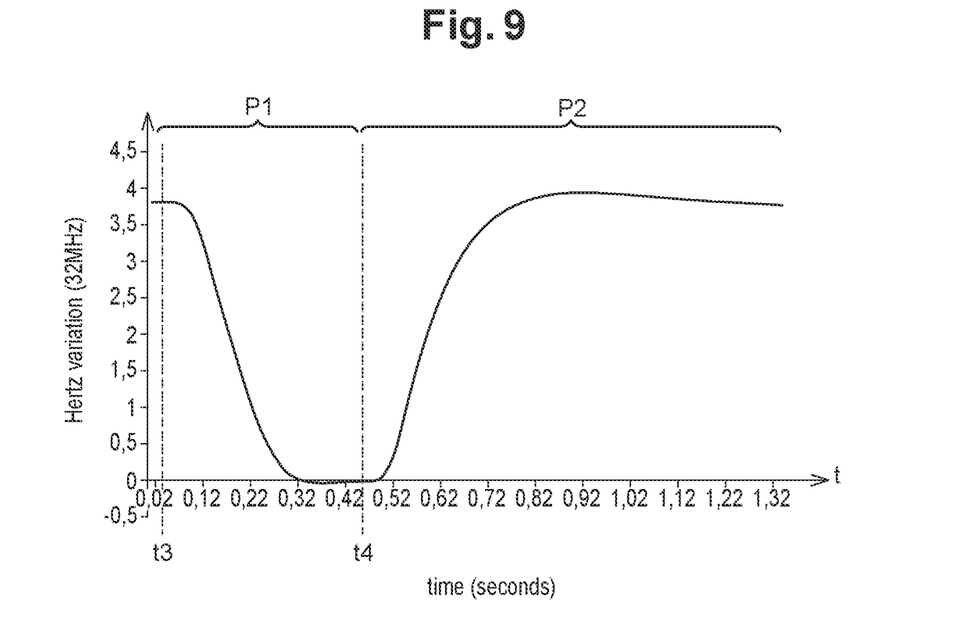
FIG. 9 is a graph illustrating the impact of variations of temperature on a quartz during the first 300 ms.

FIG. 9 is a graph illustrating the impact of variations of temperature on a quartz. In particular, FIG. 9 illustrates an example of variations of the drift (Hertz variation (32 MHz)) of the frequency, or the frequency variation, of the clock signal provided by the oscillation circuit to the circuit 20 of FIG. 8, around a carrier frequency as a function of time (time (seconds)).

The values of the drift correspond to a desired carrier frequency of 32 MHz. The values of the drift are expressed in Hertz. The values of time are expressed in seconds.

The variations represented in FIG. 9 are independent of the temperature variations caused by the power amplifier 21. For example, the variations represented in FIG. 9 correspond to a situation where the power amplifier 21 is disabled, and has no impact on the temperature.

It is considered, during the range of time considered in the graph, that the quartz and the oscillator have been on for enough time to be in steady state. Therefore, the variations described below are only caused by the variation of temperature of the heater 62.

At an instant t3, the heater 62 starts heating and a first phase P1 starts. More precisely, the control circuit 32 controls the heater 62 in order to increase the temperature of the heater. For example, the control signal EN3 generated by the control circuit 32 takes the first value. For example, the control circuit 32 increases the current going through the heater.

After the instant t3, during the first phase P1, the temperature of the heater increases. For example, the temperature increases until a threshold and stops increasing. The temperature of the heater is not purposefully decreased during the first phase P1.

One observes a decrease in the value of the drift as a consequence of the increase of the temperature. The absolute value of the drift is reduced.

In the example of FIG. 9, the decrease of the frequency is approximately 3.8 Hz during the first phase, approximately 0.30 seconds after the instant t3.

At an instant t4, the first phase P1 ends, and a second phase P2 starts. The control circuit 32 stops heating the heater. For example, the control signal EN3 generated by the control circuit 32 takes the first value. For example, the control circuit 32 decreases, preferably stops, the current going through the resistor. The temperature of the heater, and of the quartz, therefore decreases during the second phase.

For example, the temperature decreases until reaching the temperature of the instant t3.

One observes an increase in the value of the drift during the second phase P2. The value of the drift becomes farther from 0 as time passes in the second phase P2. The absolute value of the drift increases.

In the example of FIG. 9, the drift reaches a value substantially equal to 3.8 Hz, after approximately 0.30 seconds.

The increase in temperature in the first phase P1 causes a diminution of the drift, and therefore a diminution of the absolute value of the drift. The decrease in temperature in the second phase P2 causes an increase of the drift, and therefore an increase of the absolute value of the drift.

The variations of the drift are the inverse of the variations of the temperature. The embodiment described in relation with FIGS. 8 to 11 takes advantage of this feature in order to compensate the drift caused by the power amplifier 21.

Figure 10:
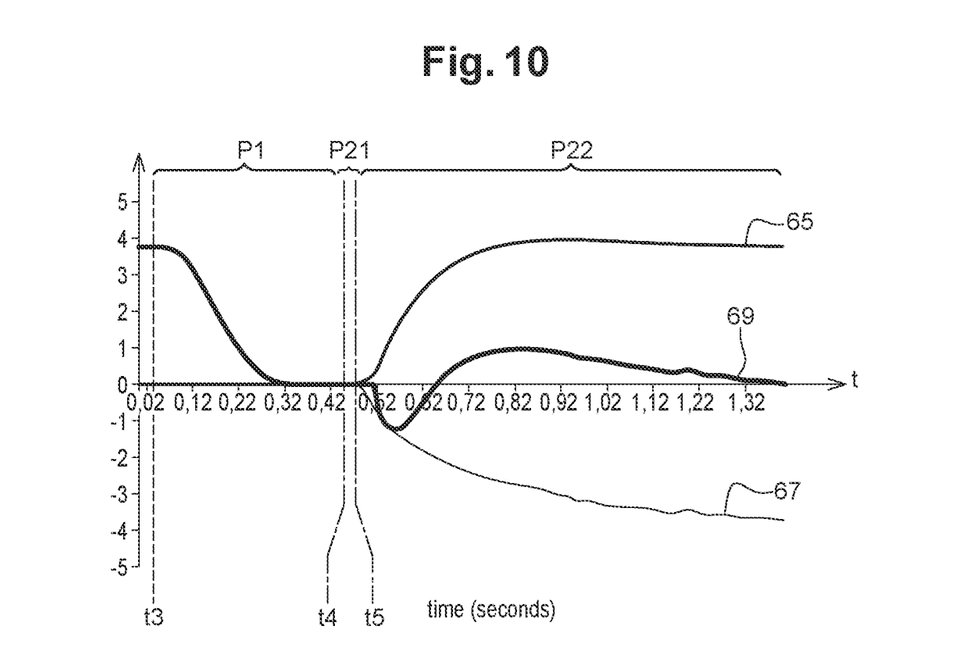
FIG. 10 is a graph illustrating an example of the drift obtained with the embodiment of FIG. 8.

FIG. 10 is a graph illustrating an example of the drift obtained with the embodiment of FIG. 8.

In particular, FIG. 10 illustrates an example of variations of the drift (Hertz variation (32 MHz)) of the frequency, or the frequency variation, of the clock signal provided by the oscillation circuit to the circuit 20 of FIG. 8, around a carrier frequency as a function of time (time (seconds)).

The values of the drift correspond to a desired carrier frequency of 32 MHz. The values of the drift are expressed in Hertz. The values of time are expressed in seconds.

FIG. 10 represents three curves. A first curve 65 is identical to the curve of FIG. 8 and represents the impact of the variation of the temperature of the heater on the drift of the carrier frequency of the clock signal provided to the circuit 20. A second curve 67 is identical to the curve of FIG. 2 and corresponds to the impact of the heating of the circuit 20 on the value of the drift of the carrier frequency of the clock signal provided to the circuit 20. A third curve 69 corresponds to the sum of the first and second curves. The third curve 69 is therefore representative of the total, and actual, drift of the carrier frequency of the clock signal provided to the circuit 20.

During the first phase P1, i.e. between the instants t3 and t4, the value of the curve 67 is equal to zero. Therefore, the curve 69 follows the variations of the curve 65. As such, the frequency decreases during the first phase.

During the first phase, as mentioned in relation with FIG. 9, the power amplifier is disabled. Therefore, the control signal EM has the second value. As circuit 20 is a RF transmitter, the transmitter does not send or receive signals during the first phase.

At the beginning of the second phase P2, in other words after the instant t4, the heater has been stopped. In this example, the drift reached zero, and the frequency is stabilized and, as it may take some time for the temperature of the quartz to decrease significantly enough to impact the frequency, the drift caused by the quartz stays substantially equal to zero for a short time, for example for less than 0.03 s. In another example, the value of the drift during this time can be different from 0.

Furthermore, at the instant t4, the power amplifier is still disabled.

At an instant t5, the power amplifier is enabled. The period between instants t4 and t5 constitutes a first part P21 of the second phase P2 and the rest of the second phase P2 constitutes the second part P22. Alternatively, the first part P21 can be removed. In this variant, the instants t4 and t5 are simultaneous.

After the instant t5, the drift caused by the decrease of the temperature of the quartz (curve 65) and the drift caused by the circuit 20 (curve 67) increase in absolute value. However, in relative value, the values of the drift caused by the decrease of the temperature of the quartz are positive and increase, while the values of the drift caused by the circuit 20 are negative and decrease. Therefore, these two components of the total drift tend to compensate each other. Indeed, the variation of the total drift (curve 69) is less important than the variation of each of the two components. The values of the total drift are closer to zero than the values of either of the two component drifts.

The embodiment of FIG. 8 takes advantage of this compensation in order to reduce the frequency drift due to the start of the power amplifier (curve 67).

In the example of FIG. 10, the curve 69 varies, during the second part P22, between approximately −1.3 Hz and approximately 1 Hz, while the values of the curve 67 is between approximately 0 Hz and −4 Hz. The values of the curve 69 are within the acceptable parameters, which are a drift having an absolute value of less than 1.4 Hz, for a desired carrier frequency of 32 MHz, in the first second of operation of the circuit 20.

The duration of the first phase P1, in other words the difference between the instants t3 and t4, is preferably chosen so that the drift caused by the heater reaches zero before the instant t4. The duration of the first part P21 of the second phase is preferably chosen to optimize the compensation of the drifts. Indeed, the decrease of the drift represented by the curve 67 starts soon after the instant t5, while the drift represented by the curve 65 can, depending on the temperature of the heater, take some time before starting to increase. Therefore, it can occasionally be useful to delay the instant t5, in regard with the instant t4.

The features of the heater, for example the value of the resistor, the temperature reached and the duration of the first phase, as well as the duration of the part P21, can be chosen depending on the application, in order to optimize the compensation. In particular, the temperature of the heater and the duration of heating can be dependent on multiple factors, for example dependent on the dimensions of the device.

According to an embodiment, the duration between the instants t2 and t3 is chosen depending on the temperature measured by a temperature sensor.

Figure 11:
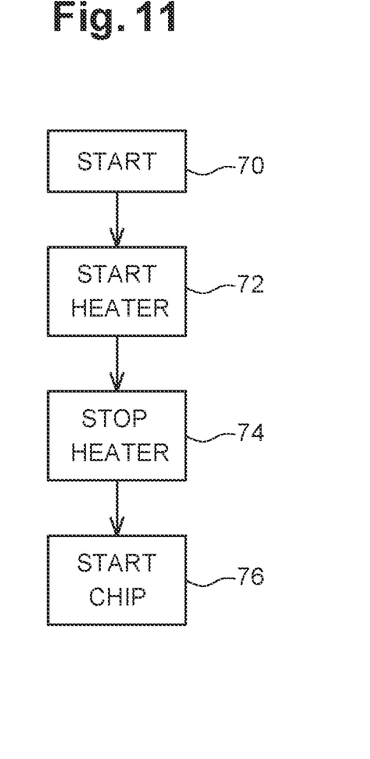
FIG. 11 illustrates an embodiment of a method of commanding the device of FIG. 8.

FIG. 11 illustrates an embodiment of a method of controlling the device of FIG. 8.

At the beginning of the method, (Block 70, START), the quartz and the oscillator are already in operation and already provide a clock signal to the circuit 20. However, the power amplifier of the circuit 20 is disabled.

The heater 62 is started (Block 72, START HEATER) by the control circuit 32. This corresponds to instant t3. For example, the control signal EN3 takes the first value. As mentioned before, the features of the heater and the temperature reached depend on the application. This corresponds to a step of preheating.

At this point, the drift caused by the heating of the heater, both by the heater and its operation, are the main causes of the drift of the carrier frequency of the clock signal provided by the oscillation circuit.

After a duration of preheating, the control circuit ceases to heat the heater (Block 74, STOP HEATER). This corresponds to instant t4. For example, the control signal EN3 takes the second value. The heater and the quartz start to cool. The frequency drift stops decreasing.

After the step represented by the block 74, the heater is preferably not used. Preferably, the heater is not used outside of the heating of the quartz during the step represented by the block 72, and especially not during the operation of the circuit 20.

Afterward, the emission of signals can be started (Block 76, START CHIP). This corresponds to instant t5.

An advantage of the described embodiment is that, during the first second of the operation of the transmitter 20, the drift of the carrier frequency is compensated and stays within desired parameters.

Another advantage of the described embodiment is that it is implemented with few modifications and components.

Various embodiments and variants have been described. Those skilled in the art will understand that certain features of these embodiments can be combined and other variants will readily occur to those skilled in the art. In particular, while the embodiment of FIGS. 6 and 7 and the embodiment of FIGS. 8 to 11 have been described in relation with a half-duplex device, they can easily be adapted to be implemented on full-duplex devices. For example, a full duplex device can comprise a switch, or an ON/OFF relay, between the output TX and the antenna, allowing or stopping signals to go from the output TX to the antenna. This switch would be controlled by the signal EN2 as it was described in the present description for the switch 29.

Furthermore, the different embodiments described can be implemented all together or two by two. For example, the embodiment of FIGS. 1 to 5 and the embodiment of FIGS. 8 to 11 can be implemented together. In this case, the power amplifier is enabled at the instant t5 of FIG. 10, and the passage of the signal between the output TX and the antenna is enabled later than the instant t5, after the delay D.

Finally, the practical implementation of the embodiments and variants described herein is within the capabilities of those skilled in the art based on the functional description provided hereinabove.

What is claimed is:

1. An electronic device comprising:
   a first capacitor and a quartz crystal coupled in series between a first node and an output node;
   an inverter having an input terminal coupled to the output node, and having an output terminal coupled to the first node;
   a first variable capacitor coupled between the first node and a third node; and
   a second variable capacitor coupled between the output node and the third node.

2. The device of claim 1, wherein a capacitance value of the first capacitor is selected, based on a target frequency, to reduce an equivalent capacitance seen by the quartz crystal with respect to a variable-capacitor capacitance resulting from the first and second variable capacitors only.

3. The device of claim 1, wherein the first variable capacitor, the first capacitor, the quartz crystal, the inverter, and the second variable capacitor are included in an oscillation circuit.

4. The device of claim 3, wherein the oscillation circuit is configured to provide a clock signal at the output node.

5. The device of claim 4, wherein the output node is coupled to a radio frequency (RF) transmitter.

6. The device of claim 1, wherein the inverter and the first and second variable capacitors are part of an integrated circuit, and wherein the quartz crystal and the first capacitor are not part of the integrated circuit.

7. The device of claim 1, wherein a capacitance value of the first capacitor is fixed.

8. The device of claim 1, further comprising a second capacitor coupled between the quartz crystal and the second variable capacitor.

9. The device of claim 1, further comprising:
a radio frequency (RF) circuit having a clock input coupled to the output node;
an antenna coupled to the RF circuit;
an oscillation circuit configured to provide a clock signal to the RF circuit, wherein the oscillation circuit comprises the first variable capacitor, the first capacitor, the quartz crystal, the inverter, and the second variable capacitor; and
a control circuit configured to:
enable a power amplifier of the RF circuit; and
enable a passage of an RF signal from the RF circuit to the antenna, wherein the passage of the RF signal from the RF circuit to the antenna is delayed with respect to an instant from which the power amplifier is enabled.

10. The device of claim 1, further comprising a heater configured to increase a temperature of the quartz crystal.

11. A method for controlling an electronic device comprising an oscillation circuit including a first capacitor and a quartz crystal coupled in series between a first node and a second node, an inverter coupled between the first and second nodes, a first variable capacitor coupled between the first node and a third node, and a second variable capacitor coupled between the second node and the third node, the method comprising:
controlling capacitances of the first and second variable capacitors to be above 50% of maximum capacitances of the first and second variable capacitors, respectively; and
providing, by the oscillation circuit, a clock signal to a radio frequency (RF) circuit and an antenna.

12. The method of claim 11, further comprising controlling the capacitances of the first and second variable capacitors to be substantially equal.

13. The method of claim 11, further comprising:
enabling a power amplifier of the RF circuit; and
enabling a passage of an RF signal from the RF circuit to the antenna, the passage of the RF signal from the RF circuit to the antenna being delayed by a delay with respect to an instant from which the power amplifier is enabled.

14. The method of claim 13, further comprising selecting a duration of the delay based on a temperature measured by a temperature sensor of the electronic device.

15. The method of claim 14, wherein the temperature measured by the temperature sensor is indicative of an ambient temperature.

16. The method of claim 13, wherein the enabling of the passage of the RF signal from the RF circuit to the antenna corresponds to a shift of a switch from a first position to a second position, the first position being configured so that no emission can be transmitted via the antenna, and the second position being configured so that emissions can be transmitted via the antenna.

17. The method of claim 13, further comprising:
generating a single control signal to enable the power amplifier and the passage of the RF signal from the RF circuit to the antenna; and
adding the delay to the single control signal before the single control signal reaches a switch coupled between the RF circuit and the antenna, the delay being with respect to the single control signal reaching the power amplifier.

18. The method of claim 13, wherein a duration of the delay is greater than 5 ms.

19. The method of claim 11, further comprising selecting a capacitance value of the first capacitor, based on a target frequency, to reduce an equivalent capacitance seen by the quartz crystal with respect to a variable-capacitor capacitance resulting from the first and second variable capacitors only.

20. The method of claim 11, further comprising:
preheating, by a heater, the quartz crystal; and
enabling emission of signals as a temperature of the quartz crystal decreases.

* * * * *